(12) United States Patent
Yu

(10) Patent No.: US 6,287,925 B1
(45) Date of Patent: Sep. 11, 2001

(54) FORMATION OF HIGHLY CONDUCTIVE JUNCTIONS BY RAPID THERMAL ANNEAL AND LASER THERMAL PROCESS

(75) Inventor: Bin Yu, Sunnyvale, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/512,202

(22) Filed: Feb. 24, 2000

(51) Int. Cl.[7] .................................................. H01L 21/336
(52) U.S. Cl. .......................... 438/301; 438/303; 438/305; 438/306; 438/307; 438/308
(58) Field of Search .................................... 438/301, 303, 438/305, 306, 307, 308

(56) References Cited

U.S. PATENT DOCUMENTS

| | | | |
|---|---|---|---|
| 5,399,506 | * | 3/1995 | Tsukamoto ............................. 438/301 |
| 5,976,956 | * | 11/1999 | Gardner et al. ....................... 438/473 |
| 6,037,640 | * | 3/2000 | Lee ......................................... 257/408 |

* cited by examiner

Primary Examiner—John F. Niebling
Assistant Examiner—Lynne A. Gurley
(74) Attorney, Agent, or Firm—Monica H. Choi

(57) ABSTRACT

For forming a highly conductive junction in an active device area of a semiconductor substrate, a first dopant is implanted into the active device area to form a preamorphization region. A second dopant is then implanted into the preamorphization region to have a dopant profile along a depth of the preamorphization region, and the dopant profile has a dopant peak within the preamorphization region. A RTA (Rapid Thermal Anneal) is performed to recrystallize a portion of the preamorphization region from an interface between the preamorphization region and the semiconductor substrate to below the dopant peak. A LTP (Laser Thermal Process) is then performed to recrystallize a remaining portion of the preamorphization region that has not been recrystallized during the RTA (Rapid Thermal Anneal) to activate a substantial portion of the second dopant in the preamorphization region. In this manner, a relatively small portion of junction at the interface of the junction with the semiconductor substrate is recrystallized using a RTA (Rapid Thermal Anneal) process before the LTP (Laser Thermal Process). The interface of the junction with the semiconductor substrate that is recrystallized using a RTA (Rapid Thermal Anneal) has a minimized amount of crystallization defects such that the resistance of the junction is minimized. Such a highly conductive junction may be formed as a drain extension, a source extension, a drain contact junction, and a source contact junction of a field effect transistor for minimizing the series resistance at the drain and source of the field effect transistor and thus for enhancing the speed performance of the field effect transistor.

22 Claims, 3 Drawing Sheets

FORMATION OF HIGHLY CONDUCTIVE JUNCTIONS BY RAPID THERMAL ANNEAL AND LASER THERMAL PROCESS

TECHNICAL FIELD

The present invention relates generally to fabrication of integrated circuit devices having scaled-down dimensions, and more particularly, to a method for fabricating highly conductive junctions used, for example, for formation of the drain and the source of a field effect transistor, by performing a rapid thermal anneal before a laser thermal process for effective activation of a high concentration of dopant.

BACKGROUND OF THE INVENTION

A long-recognized important objective in the constant advancement of monolithic IC (Integrated Circuit) technology is the scaling-down of IC dimensions. Such scaling-down of IC dimensions reduces area capacitance and is critical to obtaining higher speed performance of integrated circuits. Moreover, reducing the area of an IC die leads to higher yield in IC fabrication. Such advantages are a driving force to constantly scale down IC dimensions.

The present invention is described for formation of highly conductive junctions for a MOSFET (Metal Oxide Semiconductor Field Effect Transistor) having scaled down dimensions. However, the present invention may be used to particular advantage for formation of a highly conductive junction as part of other integrated circuit devices having scaled down dimensions, as would be apparent to one of ordinary skill in the art of integrated circuit fabrication from the description herein.

Referring to FIG. 1, a common component of a monolithic IC is a MOSFET (Metal Oxide Semiconductor Field Effect Transistor) 100 which is fabricated within a semiconductor substrate 102. The scaled down MOSFET 100 having submicron or nanometer dimensions includes a drain extension 104 and a source extension 106 formed within an active device area 126 of the semiconductor substrate 102. The drain extension 104 and the source extension 106 are shallow junctions to minimize short-channel effects in the MOSFET 100 having submicron or nanometer dimensions, as known to one of ordinary skill in the art of integrated circuit fabrication.

The MOSFET 100 further includes a drain contact junction 108 with a drain silicide 110 for providing contact to the drain of the MOSFET 100 and includes a source contact junction 112 with a source silicide 114 for providing contact to the source of the MOSFET 100. The drain contact junction 108 and the source contact junction 112 are fabricated as deeper junctions such that a relatively large size of the drain suicide 110 and the source silicide 114 respectively may be fabricated therein to provide low resistance contact to the drain and the source respectively of the MOSFET 100.

The MOSFET 100 further includes a gate dielectric 116 and a gate structure 118 which may be a polysilicon gate. A gate silicide 120 is formed on the polysilicon gate 118 for providing contact to the polysilicon gate 118. The MOSFET 100 is electrically isolated from other integrated circuit devices within the semiconductor substrate 102 by shallow trench isolation structures 121. The shallow trench isolation structures 121 define the active device area 126, within the semiconductor substrate 102, where a MOSFET is fabricated therein.

The MOSFET 100 also includes a spacer 122 disposed on the sidewalls of the polysilicon gate 118 and the gate oxide 116. When the spacer 122 is comprised of silicon nitride (SiN), then a spacer liner oxide 124 is deposited as a buffer layer between the spacer 122 and the sidewalls of the polysilicon gate 118 and the gate oxide 116.

As dimensions of the MOSFET 100 are scaled further down to tens of nanometers, the drain extension 104 and the source extension 106 are desired to be abrupt and shallow junctions to minimize short-channel effects of the MOSFET 100, as known to one of ordinary skill in the art of integrated circuit fabrication. In addition, for enhancing the speed performance of the MOSFET 100 with scaled down dimensions, a high dopant concentration with high activation in the drain extension 104, the source extension 106, the drain contact junction 108, and the source contact junction 112 is desired.

In the prior art, dopant within the drain extension 104, the source extension 106, the drain contact junction 108, and the source contact junction 112 is activated using a RTA (Rapid Thermal Anneal) process at a relatively lower temperature such as at temperatures less than 1000° Celsius, for example, as known to one of ordinary skill in the art of integrated circuit fabrication. However, as dimensions of the MOSFET 100 are further scaled down, a RTA process is disadvantageous because thermal diffusion of the dopant within the drain extension 104 and the source extension 106 causes the drain extension 104 and the source extension 106 to become less shallow. In addition, with a RTA process, the concentration of the dopant within the drain extension 104, the source extension 106, the drain contact junction 108, and the source contact junction 112 is limited by the solid solubility of the dopant within the drain extension 104, the source extension 106, the drain contact junction 108, and the source contact junction 112, as known to one of ordinary skill in the art of integrated circuit fabrication.

Because of such limitations of using a RTA process to activate dopant within the drain extension 104, the source extension 106, the drain contact junction 108, and the source contact junction 112, a laser thermal process is also used as known in the prior art. In such a laser thermal process, the dopant within the drain extension 104, the source extension 106, the drain contact junction 108, and the source contact junction 112 is activated by directing a laser beam toward the drain extension 104, the source extension 106, the drain contact junction 108, and the source contact junction 112.

Activation by such a laser thermal process is advantageous because the time period for heating the drain extension 104, the source extension 106, the drain contact junction 108, and the source contact junction 112 is on the order of a few nanoseconds (which is approximately eight orders of magnitude shorter than a RTA process). Thus, thermal diffusion of dopant within the drain extension 104 and the source extension 106 is negligible such that the drain extension 104 and the source extension 106 remain shallow, as known to one of ordinary skill in the art of integrated circuit fabrication.

In addition, because the semiconductor material forming the drain extension 104 and the source extension 106 becomes molten and then recrystallizes, the drain extension 104 and the source extension 106 formed by activation using the laser thermal process is an abrupt junction. Furthermore, because the melting and recrystallization time period is on the order of hundreds of nanoseconds, the activated dopant concentration within the drain extension 104, the source extension 106, the drain contact junction 108, and the source contact junction 112 is well above the solid solubility, as known to one of ordinary skill in the art of integrated circuit fabrication.

Despite such advantages of the laser thermal process, the drain extension 104, the source extension 106, the drain contact junction 108, and the source contact junction 112 formed using the laser thermal process may also have disadvantageous features. For example, when such junctions are activated using the laser thermal process, the interface of such junctions with the semiconductor substrate 102 has crystallization defects, as known to one of ordinary skill in the art of integrated circuit fabrication. Such crystallization defects result in large series resistance at the drain and source of the MOSFET 100 and in turn in degradation of the speed performance of the MOSFET 100.

Nevertheless, as the MOSFET is further scaled down, a laser thermal process for activating dopant in the drain extension 104 and the source extension 106 of the MOSFET is desired for fabrication of drain and source extensions that are shallow and abrupt junctions with high concentration of dopant. Thus, a process is desired for fabricating shallow and abrupt drain and source extensions with high concentration of dopant using the laser thermal process while at the same time minimizing the crystallization defects to minimize high series resistance at the drain and source of the MOSFET such that the speed performance of the MOSFET is enhanced.

SUMMARY OF THE INVENTION

Accordingly, in a general aspect of the present invention, a junction that is abrupt and shallow and that has high concentration of dopant is fabricated using a laser thermal process with minimization of crystallization defects at the interface of the junction with the semiconductor substrate.

Generally, in one embodiment of the present invention, for forming a highly conductive junction in an active device area of a semiconductor substrate, a first dopant is implanted into the active device area to form a preamorphization region. A second dopant is then implanted into the preamorphization region to have a dopant profile along a depth of the preamorphization region, and the dopant profile has a dopant peak within the preamorphization region. A RTA (Rapid Thermal Anneal) is performed to recrystallize a portion of the preamorphization region from a junction between the preamorphization region and the semiconductor substrate to below the dopant peak. A LTP (Laser Thermal Process) is then performed to recrystallize a remaining portion of the preamorphization region that has not been recrystallized during the RTA (Rapid Thermal Anneal) to activate a substantial portion of the second dopant in the preamorphization region.

In this manner, a relatively small portion of junction at the interface of the junction with the semiconductor substrate is recrystallized using a RTA (Rapid Thermal Anneal) process before the LTP (Laser Thermal Process). The interface of the junction with the semiconductor substrate that is recrystallized using a RTA (Rapid Thermal Anneal) has a minimized amount of crystallization defects such that the resistance of the junction is minimized.

The present invention may be used to particular advantage when such a highly conductive junction is formed as a drain extension, a source extension, a drain contact junction, and a source contact junction of a field effect transistor for minimizing the series resistance at the drain and source of the field effect transistor and thus for enhancing the speed performance of the field effect transistor.

These and other features and advantages of the present invention will be better understood by considering the following detailed description of the invention which is presented with the attached drawings.

BRIEF DESCRIPTION OF THE DRAWINGS

The figures referred to herein are drawn for clarity of illustration and are not necessarily drawn to scale. Elements having the same reference number in FIGS. 1, 2, 3, 4, 5, 6, 7, and 8 refer to elements having similar structure and function.

DETAILED DESCRIPTION

The present invention is described for formation of highly conductive junctions for a MOSFET (Metal Oxide Semiconductor Field Effect Transistor) having scaled down dimensions. However, the present invention may be used to particular advantage for formation of a highly conductive junction as part of other integrated circuit devices having scaled down dimensions, as would be apparent to one of ordinary skill in the art of integrated circuit fabrication from the description herein.

Figure 1:
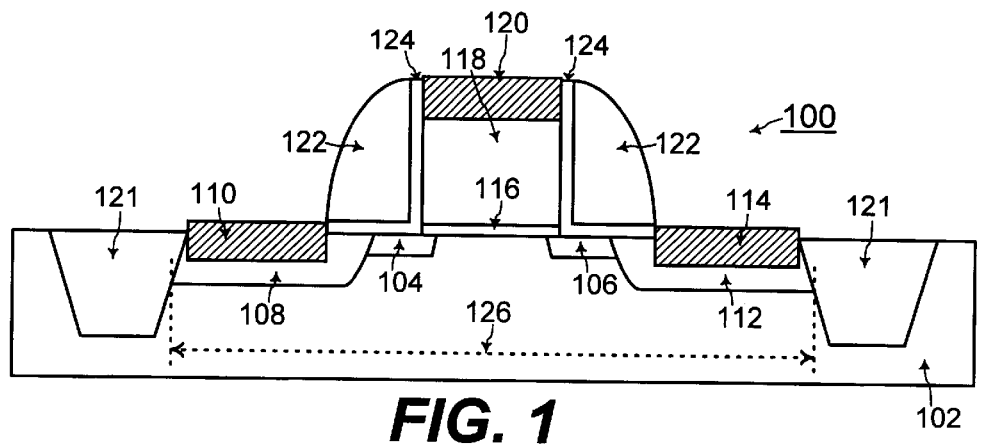
FIG. 1 shows a cross-sectional view of a MOSFET (Metal Oxide Semiconductor Field Effect Transistor) having drain and source contact junctions and drain and source extension implants.
Figure 2:
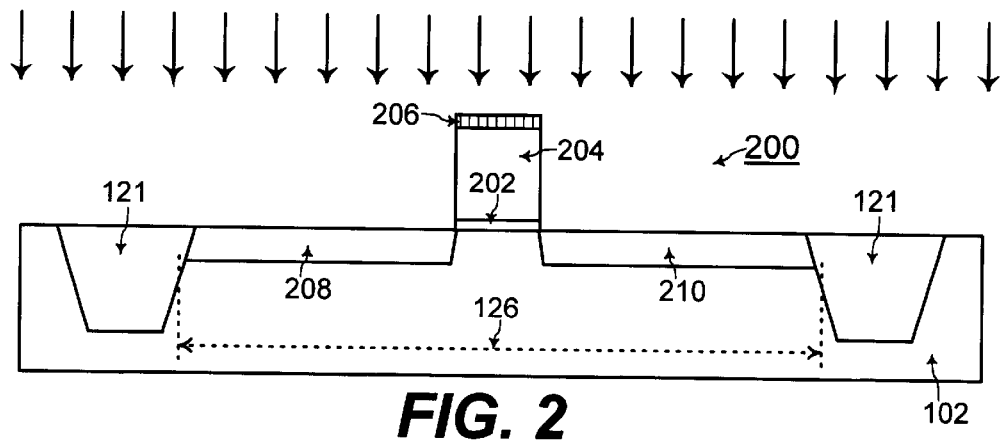
FIGS. 2, 3, 4, 5, 6, 7, and 8 show cross-sectional views of a MOSFET fabricated according to the present invention for illustrating the steps for formation of highly conductive junctions within the MOSFET by performing a relatively low temperature RTA (Rapid Thermal Anneal) for a relatively short time period before performing a LTP (Laser Thermal Process) to minimize crystallization defects at the interface of the junctions with the semiconductor substrate.

Referring to FIG. 2, in a general aspect of the present invention, a MOSFET (Metal Oxide Semiconductor Field Effect Transistor) 200 of an embodiment of the present invention having shallow abrupt and highly conductive drain and source extensions is fabricated using a laser thermal process for minimization of series resistance at the drain and source of the MOSFET 200. Referring to FIG. 2, a gate dielectric 202 is formed over the active device area 126 of the semiconductor substrate 102, and a gate structure 204 is formed over the gate dielectric 202. A gate capping layer 206, which typically is comprised of silicon nitride (SiN), generally remains on the gate structure 204 when the gate capping layer 206 is used as an antireflective layer during etching of the gate structure 204, as known to one of ordinary skill in the art of integrated circuit fabrication.

Further referring to FIG. 2, a first dopant is implanted into the active device area 126 to form a drain extension preamorphization region 208 and a source extension preamorphization region 210. The first dopant may be one of silicon ions or germanium ions. For formation of a shallow drain extension and a shallow source extension of the MOSFET 200, the drain extension preamorphization region 208 and the source extension preamorphization region 210 have a depth in a range of from about 400 Å (angstroms) to about 800 Å (angstroms) in one embodiment of the present invention.

Figure 3:
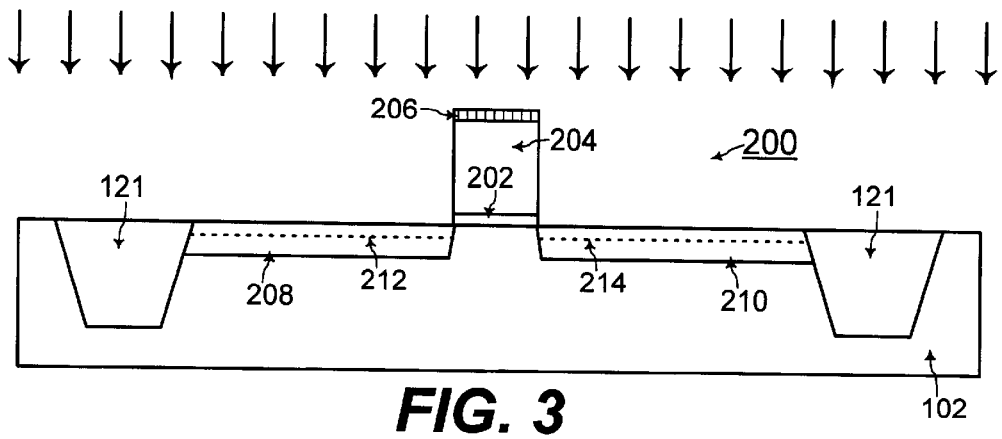

Referring to FIG. 3, after formation of the drain extension preamorphization region 208 and the source extension preamorphization region 210, according to one embodiment of the present invention, a second dopant is implanted into the drain extension preamorphization region 208 and the source extension preamorphization region 210. The second dopant is a P-type dopant for a PMOSFET (P-channel Metal Oxide Semiconductor Field Effect Transistor) and is an N-type dopant for an NMOSFET (N-channel Metal Oxide Semiconductor Field Effect Transistor).

As known to one of ordinary skill in the art of integrated circuit fabrication, such implantation of the second dopant results in a drain extension dopant profile along the depth of the drain extension preamorphization region 208 and results in a source extension dopant profile along the depth of the source extension preamorphization region 210. Referring to FIG. 3, the drain extension dopant profile has a drain extension dopant peak 212 at a predetermined depth within the drain extension preamorphization region 208 (shown as dashed line 212 in FIG. 3). Similarly, the source extension dopant profile has a source extension dopant peak 214 at a predetermined depth within the source extension preamorphization region 210 (shown as dashed line 214 in FIG. 3). In one embodiment of the present invention, the drain extension dopant peak 212 is at approximately ⅓ of the depth of the drain extension preamorphization region 208, and the source extension dopant peak 214 is at approximately ⅓ of the depth of the source extension preamorphization region 210.

Figure 4:
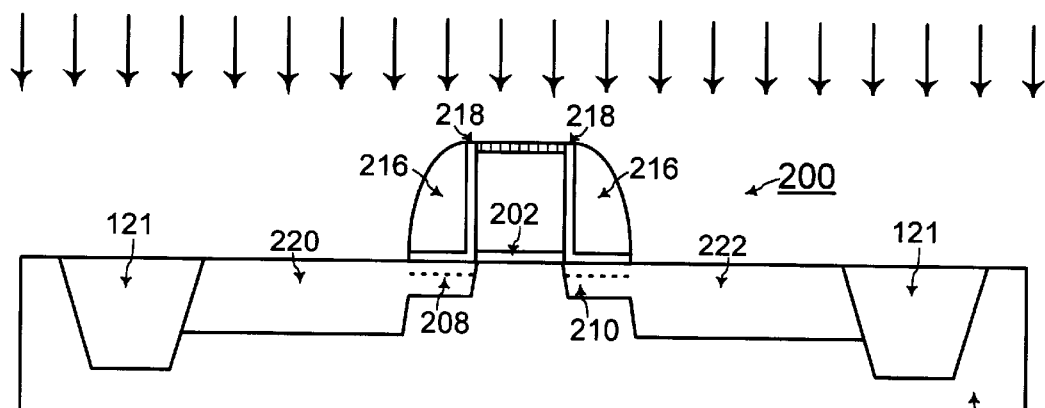

Referring to FIG. 4, a spacer 216 is formed to be disposed on the sidewalls of the gate structure 204, the gate oxide 202, and gate capping layer 206. When the spacer 216 is comprised of silicon nitride (SiN), then a spacer liner oxide 218 is deposited as a buffer layer between the spacer 216 and the sidewalls of the gate structure 204, the gate oxide 202, and gate capping layer 206. Processes for formation of the gate structure 216 and the spacer liner oxide 218 are known to one of ordinary skill in the art of integrated circuit fabrication.

Further referring to FIG. 4, the first dopant is implanted into the active device area 126 to form a drain contact preamorphization region 220 and a source contact preamorphization region 222. The drain contact preamorphization region 220 and the source contact preamorphization region 222 have a depth in a range of from about 900 Å (angstroms) to about 1100 Å (angstroms), in one embodiment of the present invention.

Figure 5:
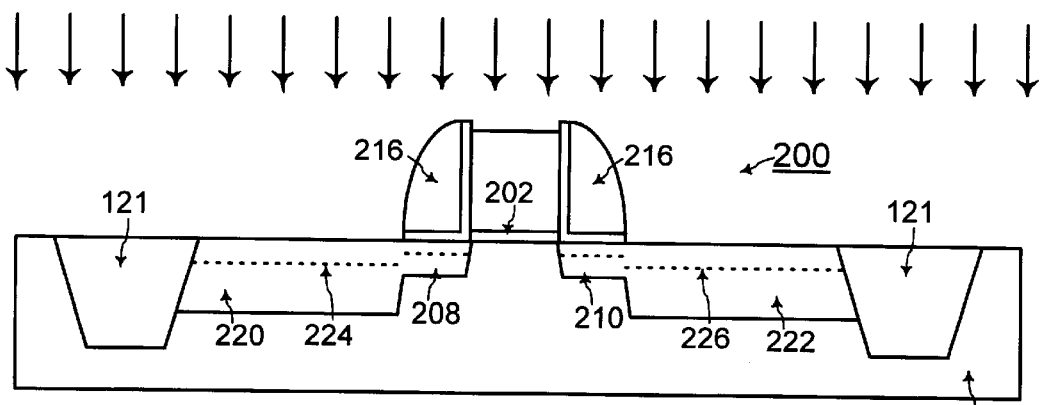

Referring to FIG. 5, after formation of the drain contact preamorphization region 220 and the source contact preamorphization region 222, according to one embodiment of the present invention, the gate capping layer 206 is removed from the gate structure 204, and the second dopant is implanted into the drain contact preamorphization region 220, the source contact preamorphization region 222, and the gate structure 204. The second dopant is a P-type dopant for a PMOSFET (P-channel Metal Oxide Semiconductor Field Effect Transistor) and is an N-type dopant for an NMOSFET (N-channel Metal Oxide Semiconductor Field Effect Transistor).

As known to one of ordinary skill in the art of integrated circuit fabrication, such implantation of the second dopant results in a drain contact dopant profile along the depth of the drain contact preamorphization region 220 and results in a source contact dopant profile along the depth of the source contact preamorphization region 222. Referring to FIG. 5, the drain contact dopant profile has a drain contact dopant peak 224 at a predetermined depth within the drain contact preamorphization region 220 (shown as dashed line 224 in FIG. 5). Similarly, the source contact dopant profile has a source contact dopant peak 226 at a predetermined depth within the source contact preamorphization region 222 (shown as dashed line 226 in FIG. 5). In one embodiment of the present invention, the drain contact dopant peak 224 is at approximately ⅓ of the depth of the drain contact preamorphization region 208, and the source contact dopant peak 226 is at approximately ⅓ of the depth of the source contact preamorphization region 222.

Figure 6:
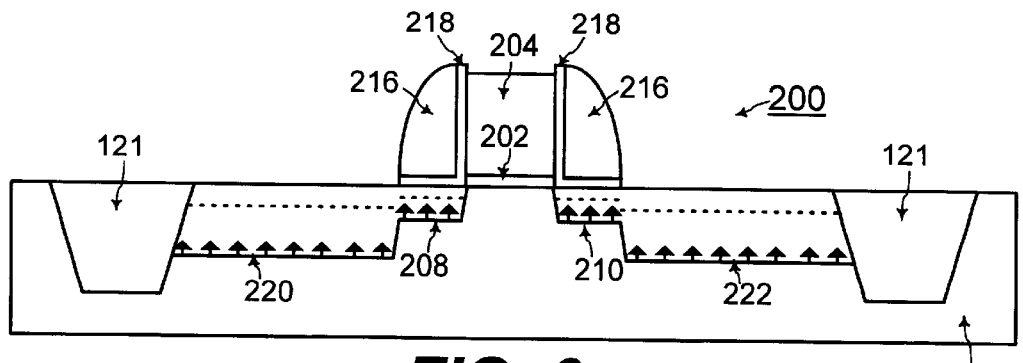

Referring to FIG. 6, a RTA (Rapid Thermal Anneal) is then performed for recrystallizing a portion of the drain extension preamorphization region 208, the source extension preamorphization region 210, the drain contact preamorphization region 220, and the source contact preamorphization region 222 from the interface between such preamorphization regions 208, 210, 220, and 222 and the semiconductor substrate 102 (as shown by the arrows in FIG. 6). The RTA (Rapid Thermal Anneal) is performed at a relatively low temperature in a range of from about 500° Celsius to about 550° Celsius and for a relatively short time period of from about 10 seconds to about 30 seconds to minimize thermal diffusion of the second dopant within such preamorphization regions 208, 210, 220, and 222. In addition, the RTA (Rapid Thermal Anneal) at such relatively low temperature and for a relatively short period of time also ensures that a portion of such preamorphization regions 208, 210, 220, and 222 is recrystallized from the interface between such preamorphization regions 208, 210, 220, and 222 and the semiconductor substrate 102 to below the dopant peak of the second dopant in such preamorphization regions.

For the example RTA (Rapid Thermal Anneal) that is performed at a temperature in a range of from about 500° Celsius to about 550° Celsius and for a time period of from about 10 seconds to about 30 seconds, the portion of the drain extension preamorphization region 208 that is recrystallized is in a range of from about 20 Å (angstroms) to about 50 Å (angstroms) from the interface between the drain extension preamorphization region 208 and the semiconductor substrate 102. Similarly, for such a RTA (Rapid Thermal Anneal), the portion of the source extension preamorphization region 210 that is recrystallized is in a range of from about 20 Å (angstroms) to about 50 Å (angstroms) from the interface between the source extension preamorphization region 210 and the semiconductor substrate 102.

In addition, the portion of the drain contact preamorphization region 220 that is recrystallized is in a range of from about 20 Å (angstroms) to about 50 Å (angstroms) from the interface between the drain contact preamorphization region 220 and the semiconductor substrate 102. Furthermore, the portion of the source contact preamorphization region 222 that is recrystallized is in a range of from about 20 Å (angstroms) to about 50 Å (angstroms) from the interface between the source contact premorphization region 222 and the semiconductor substrate 102.

Figure 7:
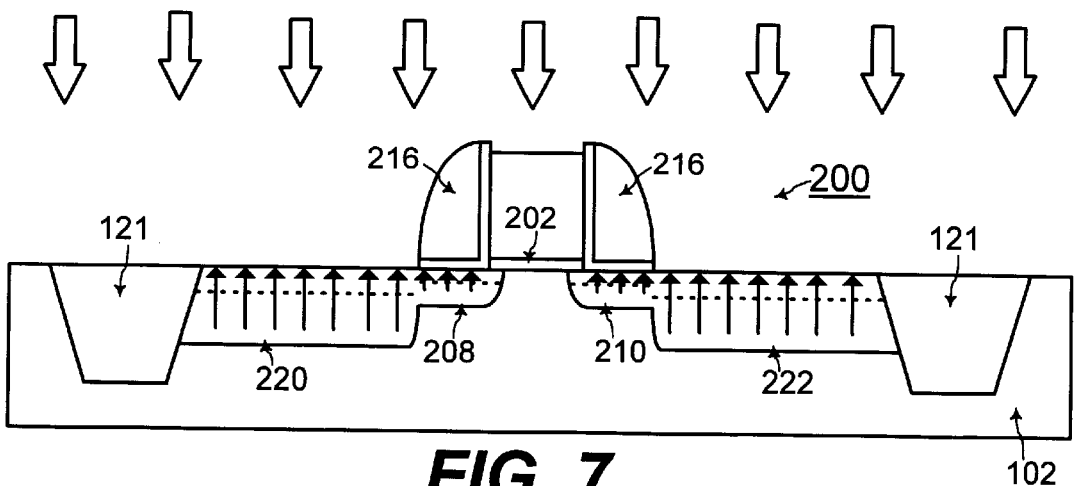

Referring to FIG. 7, after the RTA (Rapid Thermal Anneal) at the relatively low temperature and for the relatively short time period, a LTP (Laser Thermal Process) is performed whereby laser beams are directed towards the semiconductor wafer 102. LTP processes are known to one of ordinary skill in the art of integrated circuit fabrication. During the LTP (Laser Thermal Process), the remaining portion of the drain extension preamorphization region 208, the source extension preamorphization region 210, the drain contact preamorphization region 220, and the source contact preamorphization region 222 that has not been recrystallized during the RTA (Rapid Thermal Anneal) is recrystallized (as shown by the arrows in FIG. 7) to activate a substantial portion of the second dopant within such preamorphization regions 208, 210, 220, and 222.

Figure 8:
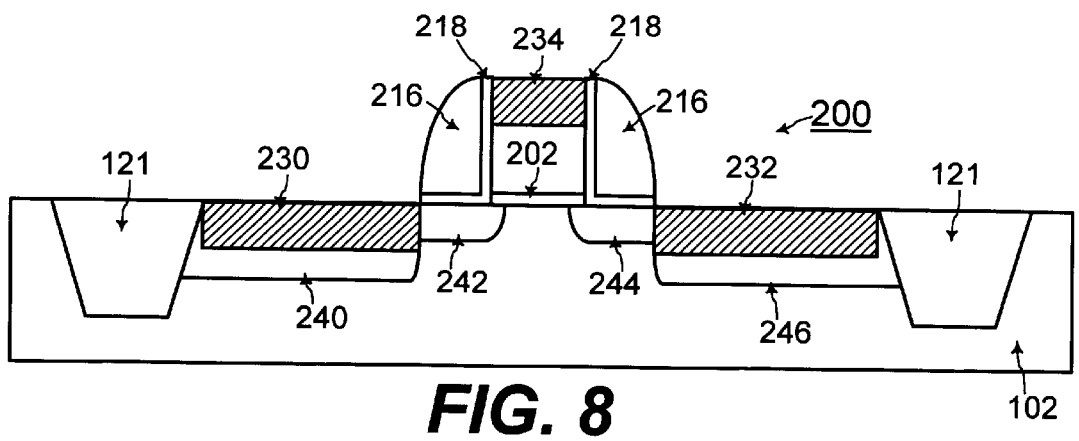

In this manner, referring to FIG. 8, a drain contact region 240, a drain extension 242, a source extension 244, and a source contact region 246 are formed from activation of the second dopant in the preamorphization regions 208, 210, 220, and 222. Activation by the LTP (Laser Thermal Process) is advantageous because the time period for heating such preamorphization regions 208, 210, 220, and 222 is on the order of a few nanoseconds (which is approximately eight orders of magnitude shorter than a RTA process). Thus, thermal diffusion of dopant within such preamorphization regions 208, 210, 220, and 222 is negligible such that the drain extension 242 and the source extension 244 remain shallow, as known to one of ordinary skill in the art of integrated circuit fabrication.

In addition, because the semiconductor material forming such preamorphization regions 208, 210, 220, and 222 becomes molten and then recrystallizes, the drain extension 242 and the source extension 244 formed by activation using the laser thermal process are abrupt junctions. Furthermore, because the melting and recrystallization time period is on the order of hundreds of nanoseconds, the activated dopant concentration within such preamorphization regions 208, 210, 220, and 222 is well above the solid solubility, as known to one of ordinary skill in the art of integrated circuit fabrication. With such a highly concentrated dopant concentration within such preamorphization regions 208, 210, 220, and 222, the series resistance at the drain and the source of the MOSFET 200 is minimized, and thus the speed performance of the MOSFET 200 is enhanced.

Furthermore, by performing the RTA (Rapid Thermal Process) at a relatively low temperature for a relatively short time period before the LTP (Laser Thermnal Process), crystallization defects at the interface of the preamorphization regions 208, 210, 220, and 222 and the semiconductor substrate 102 is minimized. Thus, the series resistance at the drain and the source of the MOSFET 200 is further minimized for enhancement of the speed performance of the MOSFET 200.

Referring to FIG. 8, a drain suicide 230 is formed with the drain contact junction 240 for providing contact to the drain of the MOSFET 200, and a source silicide 232 is formed with the source contact junction 246 for providing contact to the source of the MOSFET 200. A gate silicide 234 is formed with the gate structure 204 for providing contact to the gate of the MOSFET 200. Such silicides may be comprised of one of cobalt siticide ($CoSi_2$) or titanium silicide ($TiSi_2$) for example, and processes for formation of such suicides are known to one of ordinary skill in the art of integrated circuit fabrication.

The foregoing is by way of example only and is not intended to be limiting. For example, any specified thickness or any specified material of any structure described herein is by way of example only. Furthermore, as will be understood by those skilled in the art, the structures described herein may be made or used in the same way regardless of their position and orientation. Accordingly, it is to be understood that terms and phrases such as "sidewall" as used herein refer to relative location and orientation of various portions of the structures with respect to one another, and are not intended to suggest that any particular absolute orientation with respect to external objects is necessary or required.

In addition, the present invention is described for formation of highly conductive junctions for a MOSFET (Metal Oxide Semiconductor Field Effect Transistor) having scaled down dimensions. However, the present invention may be used to particular advantage for formation of a highly conductive junction as part of other integrated circuit devices having scaled down dimensions, as would be apparent to one of ordinary skill in the art of integrated circuit fabrication from the description herein.

The present invention is limited only as defined in the following claims and equivalents thereof.

I claim:

1. A method for forming highly conductive drain and source of a field effect transistor in an active device area of a semiconductor substrate, the method including the steps of:

A. implanting a first dopant into said active device area to form a drain extension preamorphization region and a source extension preamorphization region;

B. implanting a second dopant into said drain extension preamorphization region to have a drain extension dopant profile along a depth of said drain extension preamorphization region and into said source extension preamorphization region to have a source extension dopant profile along a depth of said source extension preamorphization region, said drain extension dopant profile having a drain extension dopant peak and said source extension dopant profile having a source extension dopant peak;

C. performing a RTA (Rapid Thermal Anneal) to recrystallize a portion of said drain extension preamorphization region from a junction between said drain extension preamorphization region and said semiconductor substrate to below said drain extension dopant peak, and to recrystallize a portion of said source extension preamorphization region from a junction between said source extension preamorphization region and said semiconductor substrate to below said source extension dopant peak; and D. performing a LTP (Laser Thermal Process) to recrystallize a remaining portion of said drain extension preamorphization region that has not been recrystallized in said step C to activate a substantial portion of said second dopant in said drain extension preamorphization region, and to recrystallize a remaining portion of said source extension preamorphization region that has not been recrystallized in said step C to activate a substantial portion of said second dopant in said source extension preamorphization region.

2. The method of claim 1, further including the steps of:

E. implanting said first dopant into said active device area to form a drain contact preamorphization region and a source contact preamorphization region;

F. implanting said second dopant into said drain contact preamorphization region to have a drain contact dopant profile along a depth of said drain contact preamorphization region and into said source contact preamorphization region to have a source contact dopant profile along a depth of said source contact preamorphization region, said drain contact dopant profile having a drain contact dopant peak and said source contact dopant profile having a source contact dopant peak;

G. recrystallizing, during said RTA (Rapid Thermal Anneal) of said step C, a portion of said drain contact preamorphization region from a junction between said drain contact preamorphization region and said semiconductor substrate to below said drain contact dopant peak, and recrystallizing, during said RTA (Rapid Thermal Anneal) of said step C, a portion of said source contact preamorphization region from a junction between said source contact preamorphization region and said semiconductor substrate to below said source contact dopant peak; and H. recrystallizing, during said LTP (Laser Thermal Process) of said step D, a remaining portion of said drain contact preamorphization region that has not been recrystallized in said step C to activate a substantial portion of said second dopant in said drain contact preamorphization region, and recrystallizing, during said LTP (Laser Thermal Process) of said step D, a remaining portion of said source contact preamorphization region that has not been recrystallized in said step C to activate a substantial portion of said second dopant in said source contact preamorphization region.

3. The method of claim 2, wherein said drain contact preamorphization region and said source contact preamorphization region have a depth in a range of from about 900 Å (angstroms) to about 1100 Å (angstroms).

4. The method of claim 3, wherein said drain contact dopant profile has a peak at approximately ⅓ of said depth of said drain contact preamorphization region, and wherein said source contact dopant profile has a peak at approximately ⅓ of said depth of said source contact preamorphization region.

5. The method of claim 2, wherein said first dopant is one of silicon ions and germanium ions.

6. The method of claim 2, wherein said RTA (Rapid Thermal Anneal) process is performed at a relatively low temperature in a range of from about 500° Celsius to about 550° Celsius and for a relatively short time period of from about 10 seconds to about 30 seconds to minimize thermal diffusion of said second dopant.

7. The method of claim 6, wherein said portion of said drain contact preamorphization region that is recrystallized during said RTA (Rapid Thermal Anneal) is in a range of from about 20 Å (angstroms) to about 50 Å (angstroms) from said junction between said drain contact preamorphization region and said semiconductor substrate, and wherein said portion of said source contact preamorphization region that is recrystallized during said RTA (Rapid Thermal Anneal) is in a range of from about 20 Å (angstroms) to about 50 Å (angstroms) from said junction between said source contact preamorphization region and said semiconductor substrate.

8. The method of claim 1, wherein said first dopant is one of silicon ions and germanium ions.

9. The method of claim 1, wherein said drain extension preamorphization region and said source extension preamorphization region has a depth in a range of from about 400 Å (angstroms) to about 800 Å (angstroms).

10. The method of claim 9, wherein said drain extension dopant profile has a peak at approximately ⅓ of said depth of said drain extension preamorphization region, and wherein said source extension dopant profile has a peak at approximately ⅓ of said depth of said source extension preamorphization region.

11. The method of claim 1, wherein said RTA (Rapid Thermal Anneal) process is performed at a relatively low temperature in a range of from about 500° Celsius to about 550° Celsius and for a relatively short time period of from about 10 seconds to about 30 seconds to minimize thermal diffusion of said second dopant.

12. The method of claim 11, wherein said portion of said drain extension preamorphization region that is recrystallized during said RTA (Rapid Thermal Anneal) is in a range of from about 20 Å (angstroms) to about 50 Å (angstroms) from said junction between said drain extension preamorphization region and said semiconductor substrate, and wherein said portion of said source extension preamorphization region that is recrystallized during said RTA (Rapid Thermal Anneal) is in a range of from about 20 Å (angstroms) to about 50 Å (angstroms) from said junction between said source extension preamorphization region and said semiconductor substrate.

13. The method of claim 1, wherein said field effect transistor is a MOSFET (Metal Oxide Semiconductor Field Effect Transistor).

14. The method of claim 13, wherein said second dopant is a P-type dopant for a PMOSFET (P-channel Metal Oxide Semiconductor Field Effect Transistor).

15. The method of claim 13, wherein said second dopant is an N-type dopant for an NMOSFET (N-channel Metal Oxide Semiconductor Field Effect Transistor).

16. A method for forming highly conductive drain and source of a MOSFET (Metal Oxide Semiconductor Field Effect Transistor) in an active device area of a semiconductor substrate, the method including the steps of:

A. implanting a first dopant into said active device area to form a drain extension preamorphization region and a source extension preamorphization region, wherein said first dopant is one of silicon ions and germanium ions, and wherein said drain extension preamorphization region and said source extension preamorphization region has a depth in a range of from about 400 Å (angstroms) to about 800 Å (angstroms);

B. implanting a second dopant into said drain extension preamorphization region to have a drain extension dopant profile along a depth of said drain extension preamorphization region and into said source extension preamorphization region to have a source extension dopant profile along a depth of said source extension preamorphization region, said drain extension dopant profile having a drain extension dopant peak and said source extension dopant profile having a source extension dopant peak, wherein said drain extension dopant profile has a peak at approximately ⅓ of said depth of said drain extension preamorphization region, and wherein said source extension dopant profile has a peak at approximately ⅓ of said depth of said source extension preamorphization region, and wherein said second dopant is a P-type dopant for a PMOSFET (P-channel Metal Oxide Semiconductor Field Effect Transistor), and wherein said second dopant is an N-type dopant for an NMOSFET (N-channel Metal Oxide Semiconductor Field Effect Transistor);

C. performing a RTA (Rapid Thermal Anneal) to recrystallize a portion of said drain extension preamorphization region from a junction between said drain extension preamorphization region and said semiconductor substrate to below said drain extension dopant peak, and to recrystallize a portion of said source extension preamorphization region from a junction between said source extension preamorphization region and said semiconductor substrate to below said source extension dopant peak, wherein said RTA (Rapid Thermal Anneal) process is performed at a relatively low temperature in a range of from about 500° Celsius to about 550° Celsius and for a relatively short time period of from about 10 seconds to about 30 seconds to minimize thermal diffusion of said second dopant, and wherein said portion of said drain extension preamorphization region that is recrystallized during said RTA (Rapid Thermal Anneal) is in a range of from about 20 Å (angstroms) to about 50 Å (angstroms) from said junction between said drain extension preamorphization region and said semiconductor substrate, and wherein said portion of said source extension preamorphization region that is recrystallized during said RTA (Rapid Thermal Anneal) is in a range of from about 20 Å (angstroms) to about 50 Å (angstroms) from said junction between said source extension preamorphization region and said semiconductor substrate;

D. performing a LTP (Laser Thermal Process) to recrystallize a remaining portion of said drain extension preamorphization region that has not been recrystallized in said step C to activate a substantial portion of said second dopant in said drain extension preamorphization region, and to recrystallize a remaining portion of said source extension preamorphization region that has not been recrystallized in said step C to activate a substantial portion of said second dopant in said source extension preamorphization region;

E. implanting said first dopant into said active device area to form a drain contact preamorphization region and a source contact preamorphization region, wherein said drain contact preamorphization region and said source contact preamorphization region have a depth in a range of from about 900 Å (angstroms) to about 1100 Å (angstroms);

F. implanting said second dopant into said drain contact preamorphization region to have a drain contact dopant profile along a depth of said drain contact preamorphization region and into said source contact preamorphization region to have a source contact dopant profile along a depth of said source contact preamorphization region, said drain contact dopant profile having a drain contact dopant peak and said source contact dopant profile having a source contact dopant peak, wherein said drain contact dopant profile has a peak at approximately ⅓ of said depth of said drain contact preamorphization region, and wherein said source contact dopant profile has a peak at approximately ⅓ of said depth of said source contact preamorphization region;

G. recrystallizing, during said RTA (Rapid Thermal Anneal) in said step C, a portion of said drain contact preamorphization region from a junction between said drain contact preamorphization region and said semiconductor substrate to below said drain contact dopant peak, and recrystallizing, during said RTA (Rapid Thermal Anneal) in said step C, a portion of said source contact preamorphization region from a junction between said source contact preamorphization region and said semiconductor substrate to below said source contact dopant peak, wherein said RTA (Rapid Thermal Anneal) process is performed at a relatively low temperature in a range of from about 500° Celsius to about 550° Celsius and for a relatively short time period of from about 10 seconds to about 30 seconds to minimize thermal diffusion of said second dopant, and wherein said portion of said drain contact preamorphization region that is recrystallized during said RTA (Rapid Thermal Anneal) is in a range of from about 20 Å (angstroms) to about 50 Å (angstroms) from said junction between said drain contact preamorphization region and said semiconductor substrate, and wherein said portion of said source contact preamorphization region that is recrystallized during said RTA (Rapid Thermal Anneal) is in a range of from about 20 Å (angstroms) to about 50 Å (angstroms) from said junction between said source contact preamorphization region and said semiconductor substrate; and H. recrystallizing, during said LTP (Laser Thermal Process) in said step D, a remaining portion of said drain contact preamorphization region that has not been recrystallized in said step C to activate a substantial portion of said second dopant in said drain contact preamorphization region, and recrystallizing, during said LTP (Laser Thermal Process) in said step D, a remaining portion of said source contact preamorphization region that has not been recrystallized in said step C to activate a substantial portion of said second dopant in said source contact preamorphization region.

17. A method for forming a highly conductive junction in an active device area of a semiconductor substrate, the method including the steps of:

A. implanting a first dopant into said active device area to form a preamorphization region;

B. implanting a second dopant into said preamorphization region to have a dopant profile along a depth of said preamorphization region, said dopant profile having a dopant peak within said preamorphization region;

C. performing a RTA (Rapid Thermal Anneal) to recrystallize a portion of said preamorphization region from a junction between said preamorphization region and said semiconductor substrate to below said dopant peak; and D. performing a LTP (Laser Thermal Process) to recrystallize a remaining portion of said preamorphization region that has not been recrystallized in said step C to activate a substantial portion of said second dopant in said preamorphization region.

18. The method of claim 17, wherein said first dopant is one of silicon ions and germanium ions.

19. The method of claim 17, wherein said preamorphization region has a depth in a range of from about 400 Å (angstroms) to about 800 Å (angstroms).

20. The method of claim 19, wherein said dopant profile has a peak at approximately ⅓ of said depth of said preamorphization region.

21. The method of claim 17, wherein said RTA (Rapid Thermal Anneal) process is performed at a relatively low temperature in a range of from about 500° Celsius to about 550° Celsius and for a relatively short time period of from about 10 seconds to about 30 seconds to minimize thermal diffusion of said second dopant.

22. The method of claim 21, wherein said portion of said preamorphization region that is recrystallized during said RTA (Rapid Thermal Anneal) is in a range of from about 20 Å (angstroms) to about 50 Å (angstroms) from said junction between said preamorphization region and said semiconductor substrate.

* * * * *